(12) United States Patent
Krüger et al.

(10) Patent No.: US 7,265,545 B2
(45) Date of Patent: Sep. 4, 2007

(54) METHOD AND APPARATUS FOR ACCELERATED SPIRAL-CODED IMAGING IN MAGNETIC RESONANCE TOMOGRAPHY

(75) Inventors: Gunnar Krüger, Erlangen (DE); Cecile Mohr, Erlangen (DE); Stefan Thesen, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/314,118

(22) Filed: Dec. 21, 2005

(65) Prior Publication Data

US 2006/0158185 A1 Jul. 20, 2006

(30) Foreign Application Priority Data

Dec. 21, 2004 (DE) .................. 10 2004 061 509

(51) Int. Cl.
*G01V 3/00* (2006.01)
(52) U.S. Cl. ....................... 324/307; 324/309
(58) Field of Classification Search ............... 324/307, 324/309
See application file for complete search history.

(56) References Cited

U.S. PATENT DOCUMENTS

| 4,307,343 | A |   | 12/1981 | Likes |            |
|-----------|---|---|---------|-------|------------|
| 4,748,410 | A | * | 5/1988  | Macovski | 324/309 |
| 5,650,723 | A | * | 7/1997  | Meyer | 324/309    |
| 6,215,306 | B1 |  | 4/2001  | Tsai et al. |       |
| 6,353,752 | B1 | * | 3/2002 | Madore et al. | 600/410 |
| 6,404,194 | B1 | * | 6/2002 | Irarrazabal et al. | 324/307 |
| 7,102,348 | B2 | * | 9/2006 | Zhang et al. | 324/309 |

OTHER PUBLICATIONS

"Fast 'Real Time' Imaging with Different k-Space Update Strategies for Interventional Procedures," —Busch et al, Journal of Magnetic Resonance Imaging, vol. 8, pp. 944-954 (1998).
"Keyhole Dixon Method for Faster, Perceptually Equivalent Fat Suppression," Flask et al, Journal of Magnetic Resonance Imaging, vol. 18, pp. 103-112 (2003).

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

In a method and apparatus for accelerated spiral-coded imaging (scanning k-space with a spiral trajectory) in magnetic resonance tomography, the user-defined sequence forming the basis of the spiral scanning is modified such that the k-matrix forming the basis of the sequence is scanned only in a sub-region, the sub-region being defined by a symmetrical shortening on both sides of the k-space matrix in a first direction as well as by a one-sided shortening of the k-space matrix in a second direction orthogonal to the first direction.

9 Claims, 4 Drawing Sheets

METHOD AND APPARATUS FOR ACCELERATED SPIRAL-CODED IMAGING IN MAGNETIC RESONANCE TOMOGRAPHY

BACKGROUND OF THE INVENTION

1. Field of the Invention

The present invention in general concerns magnetic resonance tomography (MRT) as used in medicine for the examination of patients. The present invention in particular concerns a spiral-coded method for accelerated MRT imaging as well as a magnetic resonance tomography apparatus that is suitable for implementation of the method.

2. Description of the Prior Art

MRT is based on the physical phenomenon of magnetic resonance and has been successfully used as an imaging modality for over 15 years in medicine and biophysics. In this examination modality, the subject is exposed to a strong, constant magnetic field. The nuclear spins of the atoms in the subject, which were previously randomly oriented, thereby align. Radio-frequency energy can now excite these "ordered" nuclear spins to a specific oscillation. In MRT, this oscillation generates the actual measurement signal which is acquired by means of appropriate reception coils. By the use of non-homogeneous magnetic fields generated by gradient coils, the measurement subject can be spatially coded in all three spatial directions. The method allows a free selection of the slice to be imaged, so slice images of the human body can be acquired in all directions. MRT as a slice image method in medical diagnostics is distinguished predominantly as a "non-invasive" examination method with a versatile contrast capability. Due to the excellent ability to representation of soft tissue, MRT developed into a method superior in many ways to x-ray computed tomography (CT). MRT today is based on the application of spin echo and gradient echo sequences that enable an excellent image quality with measurement times in the range of minutes.

The continuous technical development of the components of MRT apparatuses and the introduction of faster imaging sequences is always opening more fields of use in medicine to MRT. Real-time imaging to support minimally-invasive surgery, functional imaging in neurology and perfusion measurement in cardiology are only a few examples. In spite of the technical progress in the construction of MRT apparatuses, acquisition time of an MRT image remains the limiting factor for many applications of MRT in medical diagnostics. From a technical viewpoint (feasibility) and for reasons of patient protection (stimulation and tissue heating), a limit is set on a further increase of the capacity of MRT apparatuses with regard to the acquisition time. In recent years, multifaceted efforts have been undertaken to further reduce the image measurement time.

One approach to shorten the acquisition time is to reduce the quantity of the image data to be acquired. In order to obtain a complete image from such a reduced data set, either the missing data must be reconstructed with suitable algorithms or the deficient image must be corrected due to the reduced data.

The acquisition of the data in MRT occurs in k-space (frequency domain). The MRT image in the image domain is linked with the MRT data in k-space by means of Fourier transformation. The spatial coding of the subject that spans k-space occurs by means of gradients in all three spatial directions. Differentiation is made between the slice selection gradient (establishes an acquisition slice in the subject, typically the z-axis), the frequency coding gradient (establishes a direction in the slice, typically the x-axis) and the phase coding gradient (determines the second dimension within the slice, typically the y-axis).

Depending on the combination or interconnection of the three gradients in an imaging sequence, the scanning of k-space can ensue with a Cartesian (line-by-line) or radial or spiral trajectory (scanning path).

In the framework of the present invention, only a spiral scanning of k-space is considered. Spiral k-space trajectories were propagated for the first time in about 1981 as a possible alternative for Cartesian scanning (U.S. Pat. No. 4,307,343;). It is apparent that a spiral readout of the k-matrix with regard to a T2-weighted MRT imaging leads to an isotropic RF pulse response signal in contrast to, for example, a Cartesian scanning. For this reason the use of fast spiral scanning (fast spiral imaging)—as an equivalent to echoplanar imaging (echo planar imaging, EPI)—has increasingly gained in popularity, particularly in the fields of functional. MRT, perfusion MRT, MR spectroscopy, diffusion MRT and phase-contrast-based MRT flow measurements.

An unsolved problem in fast MRT imaging (fast single shot spiral scanning and fast multi shot spiral scanning and EPI) is that generally image quality reductions occur due to frequency and phase errors during the readout times of the RF response signal. These reductions are manifested in EPI as image distortions in the reconstructed image.

In fast spiral MRT imaging, the reconstructed image is locally cloudy and diffused, due to regionally-limited frequency displacements in k-space. In spiral. imaging, this error is generally designated as "blurring". The causes for this are primarily susceptibility limits and inhomogeneities in the tissue of the subject to be examined. These are generally more significantly developed given higher gradient field strengths.

Such blurring can be reduced by a shortening of the readout. In the prior art this is achieved by reducing the number of the passes (repetitions) given, a constant size of the sampled region. This has the severe disadvantage, however, that missing passes result in a lower resolution of the reconstructed image. Parallel imaging techniques (PPA, partial parallel acquisition) have been considered for use to reduce the readout duration in the spiral coding. Such methods are extremely expensive in terms of calculation time and therefore are not practically applicable at the present time.

SUMMARY OF THE INVENTION

An object of the present invention is to significantly reduce the readout duration of a spiral-shaped acquisition method without otherwise having to accept disadvantages.

This object is achieved according to the invention by a method for spiral k-space scanning in magnetic resonance tomography wherein the user-defined sequence forming the basis of the spiral scanning is modified by the k-matrix forming the basis of the sequence only being measured in a sub-region, the sub-region being defined by a symmetrical shortening at both sides of the k-space matrix in a first direction as well as by a one-sided shortening of the k-space matrix in a second direction orthogonal to the first direction.

According to the invention, the modification can ensue defined by the user or automatically.

The scanning also advantageously ensues anisotropically in at least one of the two directions. In a further embodiment of the invention the anisotropy of the scanning trajectory is adjustable.

The respective shortenings of the k-space matrix in accordance with the invention can be adjustable.

The above object also is achieved in accordance with the invention by a magnetic resonance tomography apparatus that is suitable for implementation of the method described above.

The above object also is achieved in accordance with the invention by a computer software product (a computer-readable medium encoded with program data) that implements the above-described method when it runs on a computer connected with a magnetic resonance tomography apparatus.

DESCRIPTION OF THE PREFERRED EMBODIMENTS

Figure 1:
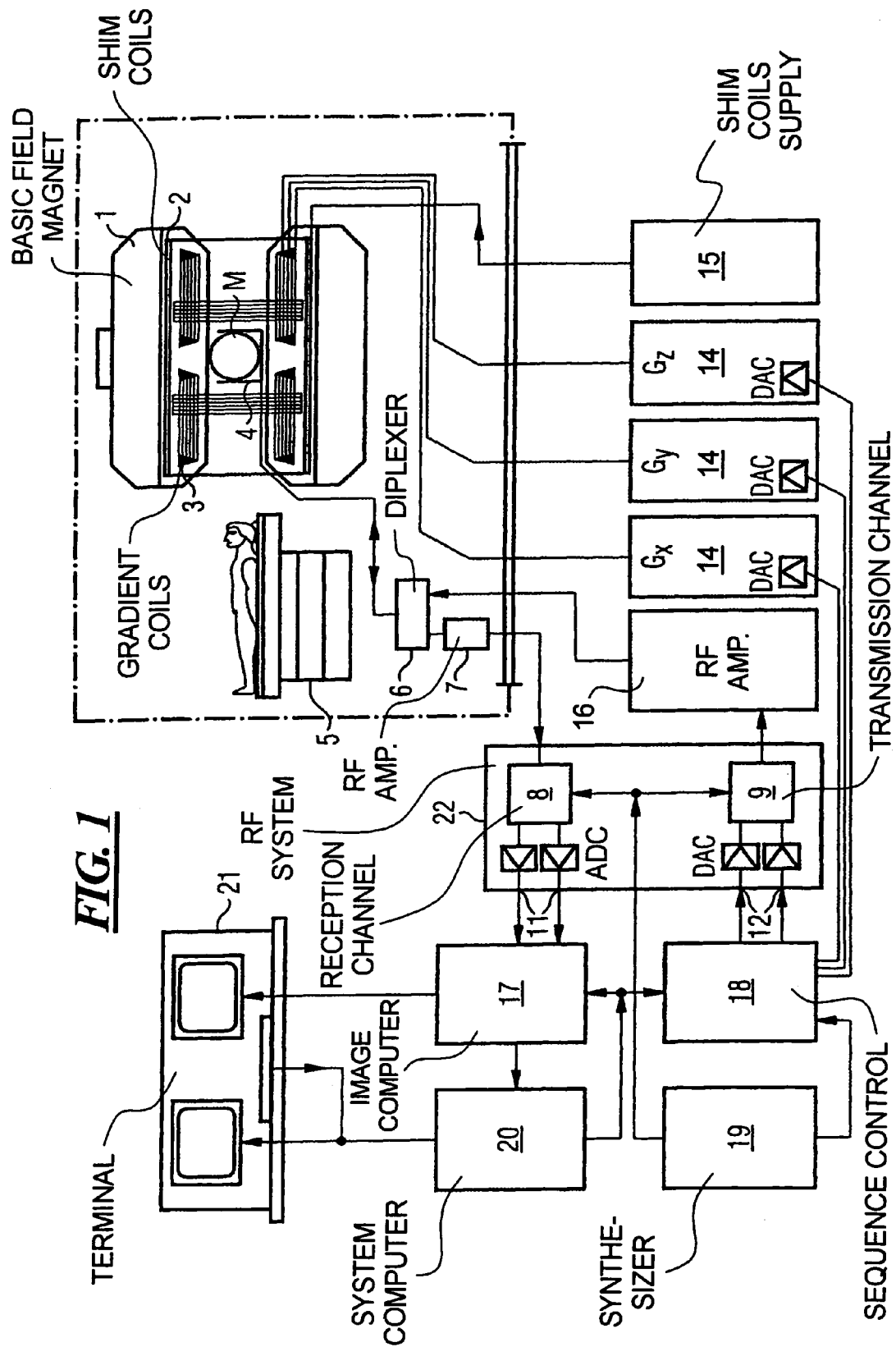
FIG. 1 schematically illustrates a magnetic resonance tomography apparatus operable in accordance with the invention.

FIG. 1 schematically illustrates a magnetic resonance imaging or tomography apparatus for generation of a magnetic resonance image of a subject according to the present invention. The design of the magnetic resonance tomography apparatus thereby corresponds to the design of a conventional magnetic tomography apparatus except for the differences described below. A basic field magnet 1 generates a temporally-constant strong magnetic field for polarization or alignment of the nuclear spins in the examination region of a subject such as, for example, a part of a human body to be examined. The high homogeneity of the basic magnetic field necessary for the magnetic resonance measurement is defined in a spherical measurement volume M in which the parts of the human body to be examined are introduced. To support the homogeneity requirements, and in particular for elimination of temporally invariable influences, shim plates made of ferromagnetic material are mounted at a suitable location. Temporally variable influences are eliminated by shim coils 2 that are activated by a shim current supply 15.

A cylindrical gradient coil system 3 that is composed of three windings is used in the basic field magnet 1. Each winding is supplied with current by an amplifier 14 for generation of a linear gradient field in the respective direction of the Cartesian coordinate system. The first coil of the gradient field system 3 thereby generates a gradient $G_x$ in the x-direction, the second coil generates a gradient $G_y$ in the y-direction and the third coil generates a gradient $G_z$ in the z-direction. Each amplifier 14 comprises a digital-analog converter that is activated by a sequence controller 18 for time-accurate generation of gradient pulses.

Located within the gradient field system 3 is a radio-frequency antenna 4 that converts the radio-frequency pulses emitted by a radio-frequency power amplifier 15 into a magnetic alternating field for excitation of the nuclei and alignment of the spins of the subject to be examined or of the region of the subject to be examined. The radio-frequency antenna 4 is composed of one or more RF transmission coils and a number of RF reception coils in the form of an arrangement (preferably a linear arrangement) of component coils. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency receiver channel 8 of a radio-frequency system 22. The radio-frequency system 22 furthermore has a transmission channel 9 in which are generated the radio-frequency pulses for the excitation of nuclear magnetic resonance. The respective radio-frequency pulses are digitally represented in the sequence controller 18 as a series of complex numbers based on a pulse sequence predetermined by the system computer 20. This number series is supplied respectively as a real part and an imaginary part via inputs 12 to a digital-analog converter in the radio-frequency system 22 and from this to a transmission channel 9. In the transmission channel 9, the pulse sequences are modulated with a radio-frequency carrier signal having a base frequency that corresponds to the resonance frequency of the nuclear spins in the measurement volume.

The switchover from transmission mode to reception mode ensues via a transmission-reception diplexer 6. The RF transmission coil of the radio-frequency antenna 4 radiates the radio-frequency pulses into the measurement volume M for excitation of the nuclear spins and samples the resulting echo signals via the RF reception coils. The thus-acquired magnetic resonance signals are phase-sensitively demodulated in the reception channel 8 of the radio-frequency system 22 and translated into a real part and an imaginary part via respective analog-digital converters. An image is reconstructed by an image computer 17 from the measurement data so acquired. The administration of the measurement data, the image data and the control programs ensues via the system computer 20. Based on with control programs, the sequence controller 18 monitors the generation of the respectively desired pulse sequences and the corresponding sampling of k-space. The sequence controller 18 controls the time-accurate switching of the gradients, the emission of the radio-frequency pulses with defined phase and amplitude and the reception of the magnetic resonance signals. The time base for the radio-frequency system 22 and the sequence controller 18 is provided by a synthesizer 19. The selection of corresponding control programs for generation of a magnetic resonance image as well as the representation of the generated magnetic resonance image ensues via a terminal 21 that has a keyboard as well as one or more screens.

Figure 2:
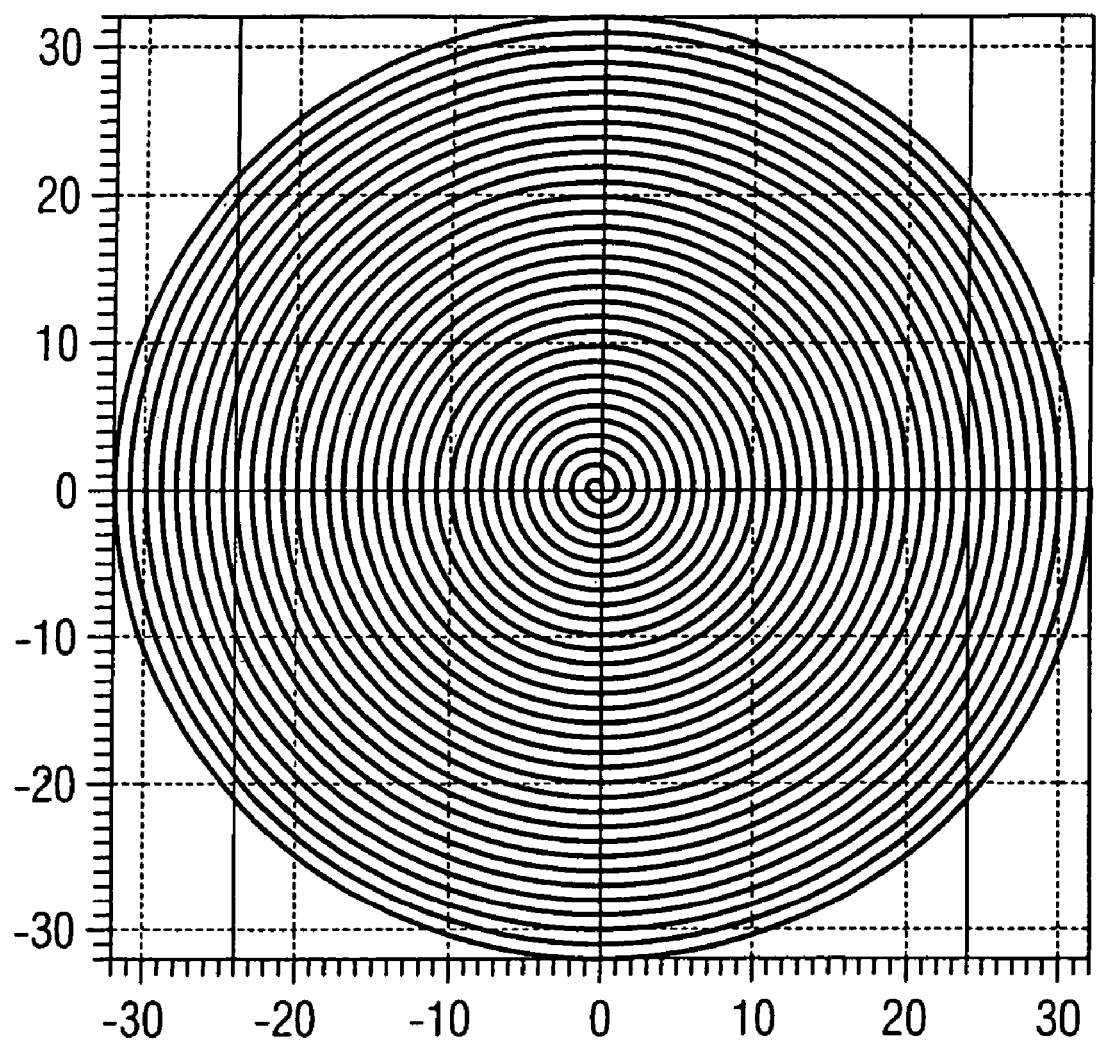
FIG. 2 shows a k-space trajectory given conventional spiral coding according to the prior art.

As in the prior art, an input of the measurement parameters by the user (generally the doctor) initially ensues in the inventive method, via a user interface that is typically presented on the screen of the terminal 21 in the form of an input window (pop-up window). The measurement system of the magnetic resonance tomography apparatus is configured on the basis of the input parameters such that this measurement system is able to generate a fast spiral scanning sequence in the transmission channel 9 via the system computer 20 and the sequence controller 19. Such a conventional sequence would scan a matrix with a spiral trajectory in k-space according to FIG. 2, and the matrix would yield an anatomical image in space via reconstruction by means of Fourier transformation, although this anatomical image would exhibit the previously-mentioned "blurring" typical for spiral coding. In order to suppress this "blurring", the conventional fast spiral scanning sequence is modified in accordance with the invention—either by a further user input or automatically—such that only a reduced part of the k-matrix forming the basis of the output sequence is scanned or traversed in the spiral trajectory. The reduction inventively ensues in a two-fold manner in what is known as the rFOV method (rectangular field of view method), combined with a partial Fourier scanning.

In the conventional Cartesian rFOV scanning, preferably outer k-space lines are not scanned in the phase coding direction in order to reduce the measurement time. This is in particular reasonable when the subject to be examined has a smaller extent in the phase coding direction than in the frequency coding direction anyway (for example an oval head), and thus time-consuming phase coding steps can be spared given a constant resolution and unchanged contrast ratio.

In contrast to this, the conventional Cartesian partial Fourier scanning uses the fact that the data points of the k-matrix are mirror-symmetrical (or point-symmetrical) with regard to the matrix center point. For this reason, it is sufficient, at maximum to measure only the values of one half of the k-matrix and to complete the unmeasured values of the other half by mirroring at the center point (and complex conjugation). In this manner the number of the sequence passes required for the phase coding given identical spatial resolution is reduced up to a maximum of one-half, which corresponds to a maximum halving of the measurement time. The scanning of the half k-matrix is generally designated as a "half Fourier technique".

Figure 3:
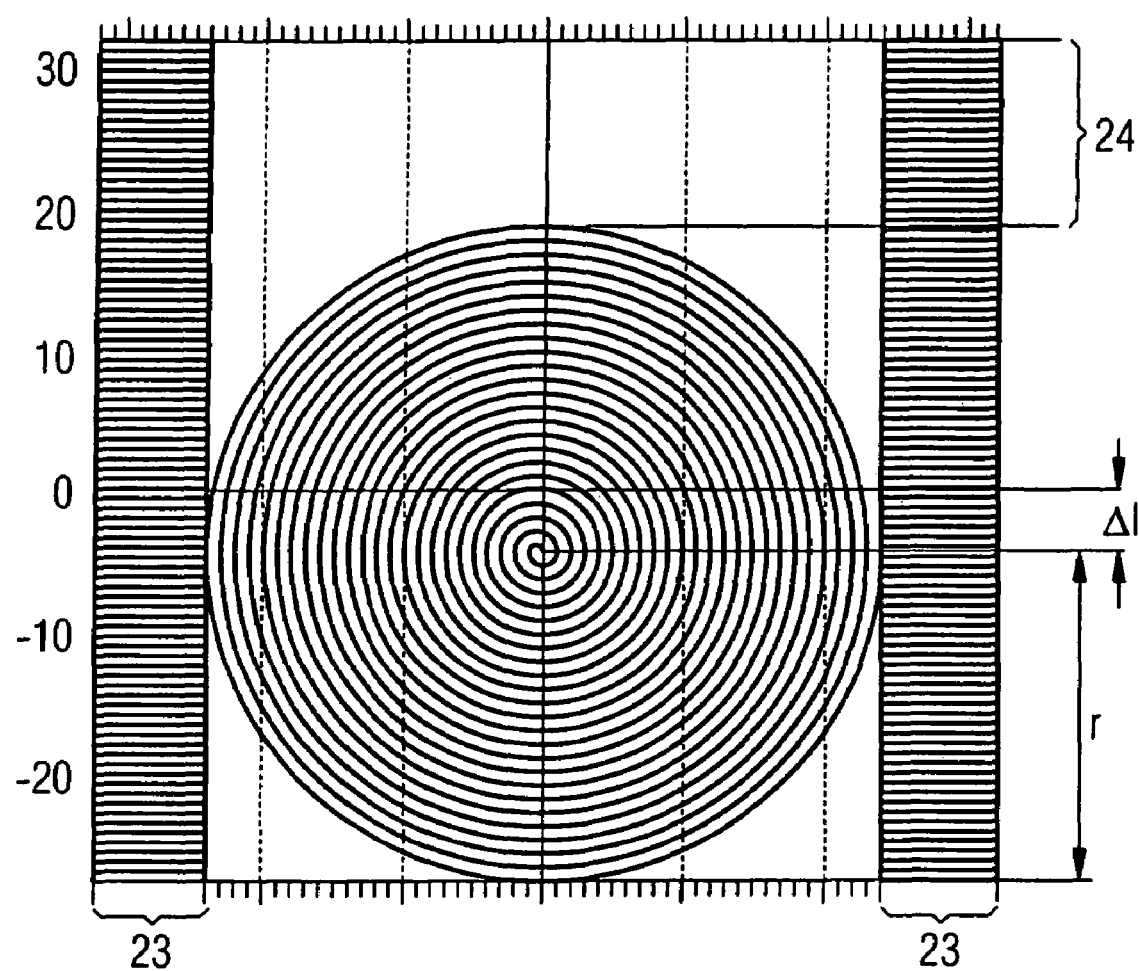
FIG. 3 shows an isotropic k-space trajectory for inventive spiral coding.

Analogous to the Cartesian rFOV scanning, according to FIG. 3 the outer (normally equally large and therefore symmetrical) strip-shaped boundary regions 23 are not measured or scanned in a first coding direction and are allocated with zeros in the system computer. This occurs by the spiral trajectory being shrunk overall and accordingly exhibits a smaller outer radius r.

If the spiral trajectory is isotropic, the shrinking of the outer radius leads to a comparable measurement data reduction on both sides in the second coding direction (orthogonal to the first coding direction). In order to compensate for this (second measurement data loss), the spiral trajectory is displaced along the second coding direction by Δ1 until it is tangent to the edge of the k-matrix. Analogous to the Cartesian partial Fourier scanning, the unmeasured region 24 along the second coding direction can be expanded by suitable algorithms based on the point symmetry (already described) of the k-matrix relative the matrix center.

In summary, the present invention combines the known and previously-described acquisition techniques rFOV and partial Fourier technique in the framework of a spiral k-space scanning in the manner described above. This leads overall to a significant reduction of the readout time (20% or more), which ultimately leads to an improved image quality (less blurring). A further advantage of the inventive method compared to the conventional partial Fourier technique is that a smaller displacement of the spiral trajectory relative to the k-matrix center point already also has as a consequence a lesser sensitivity to gradient imperfections, which are always present.

The use of one of the two methods alone (rFOV or partial Fourier) affords no remedy given non-Cartesian (in particular spiral) acquisition techniques. For this reason, both methods must be matched to one another by the reduction of the outer radius of the spiral trajectory given an isotropic scanning being linked with the displacement of the trajectory.

Figure 4:
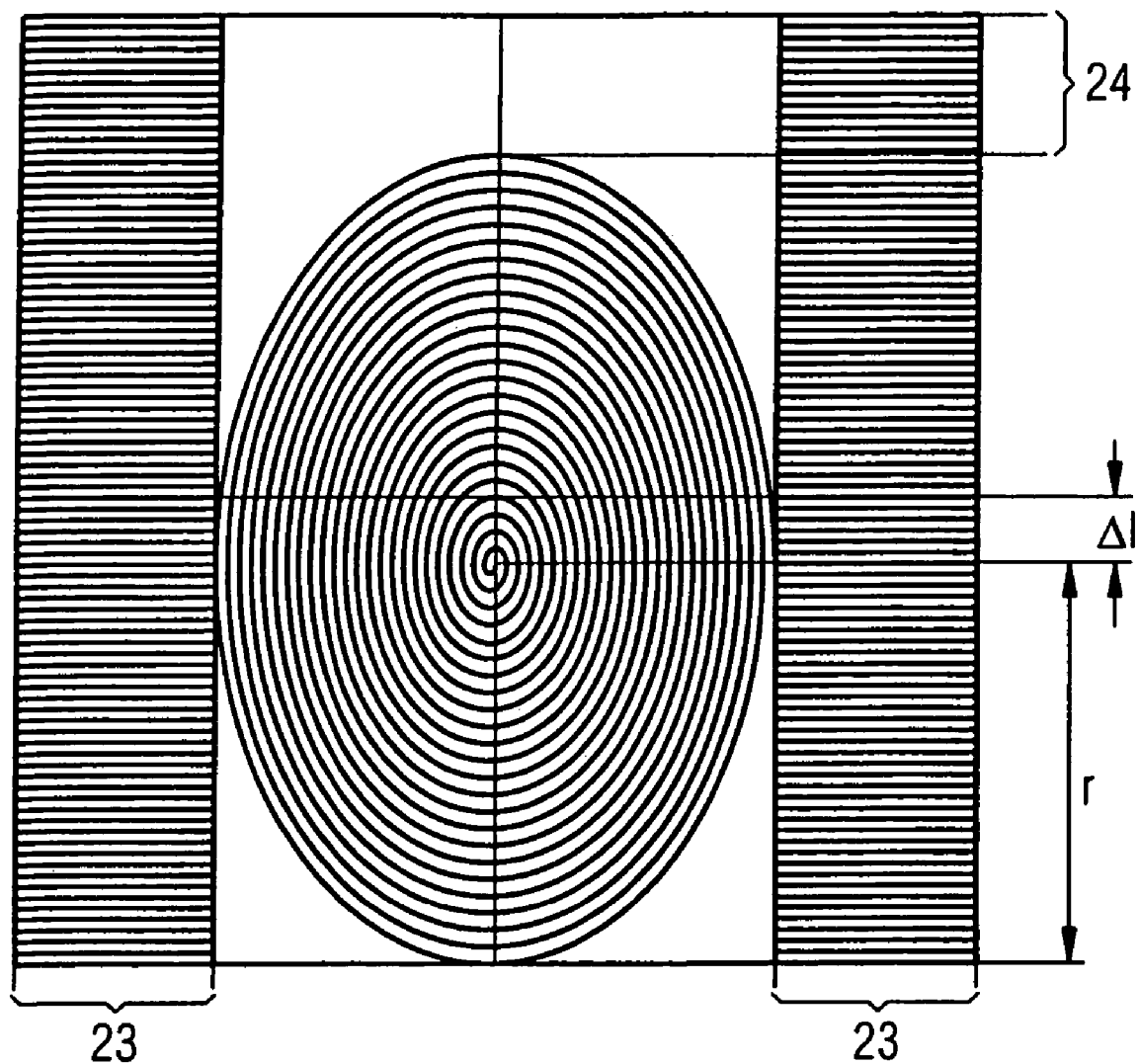
FIG. 4 shows an anisotropic k-space trajectory for inventive spiral coding.

This linking can be inventively influenced by an anisotropic spiral coding, and thus the data acquisition can be optimized overall. For example, in FIG. 4 it is shown that an anisotropy in the partial Fourier direction requires a lesser displacement of the spiral trajectory given a constant rFOV. This in turn leads to less gradient activity overall, so gradient-dependent stimulations are also reduced. The increased reconstruction effort can be accepted.

Although modifications and changes may be suggested by those skilled in the art, it is the intention of the inventors to embody within the patent warranted hereon all changes and modifications as reasonably and properly come within the scope of their contribution to the art.

The invention claimed is:

1. A method for scanning k-space in magnetic resonance tomography, comprising the steps of:
   electronically entering magnetic resonance data in a k-space matrix stored in a memory;
   electronically defining a sequence for spiral scanning of said k-space matrix in said memory to produce a set of data in a form suitable for image reconstruction;
   electronically modifying said spiral scanning to scan only a portion of said k-space matrix by electronically defining said region by symmetrically shortening said k-space matrix at each of opposite sides thereof in a first direction and shortening one side of said k-space matrix in a second direction orthogonal to said first direction; and
   conducting said spiral scanning anisotropically in at least one of said first direction or said second direction to obtain and make accessible a set of data in a form suitable for image reconstruction.

2. A method as claimed in claim 1 comprising making a manual electronic entry to modify said spiral scanning.

3. A method as claimed in claim 1 comprising automatically electronically modifying said spiral scanning.

4. A method as claimed in claim 1 comprising selectively adjusting the anisotropy of said spiral scanning.

5. A method as claimed in claim 1 comprising allowing selective adjustment of the shortening of said k-space matrix in at least one of said first direction or said second direction.

6. A magnetic resonance tomography apparatus comprising:
   a magnetic resonance scanner adapted to interact with an examination subject to acquire magnetic resonance data from the subject;
   a control unit connected to said magnetic resonance scanner that controls acquisition of said magnetic resonance data by said magnetic resonance scanner;
   a memory accessible by said control unit, said control unit entering said magnetic resonance data into a k-space matrix in said memory;
   a user interface allowing a user to enter a scanning sequence for spiral scanning of said k-space matrix to obtain a set of data in a form suitable for image reconstruction;
   said control unit modifying said spiral scanning of said k-space matrix to scan only a region of said k-space matrix, by symmetrically shortening said k-space matrix at each of opposite sides thereof in a first direction and shortening one side of said k-space matrix in a second direction orthogonal to said first direction; and
   conducting said spiral scanning anisotropically in at least one of said first direction or said second direction.

7. An apparatus as claimed in claim 6 wherein said user interface allows modification of said scanning in response to a user entry made via said user interface.

8. An apparatus as claimed in claim 6 wherein said control unit automatically modifies said scanning.

9. A computer-readable medium encoded with a data structure that, when loaded into a computer that controls operation of a magnetic resonance tomography apparatus, wherein magnetic resonance data are stored in a k-space matrix in a memory, said data structure causing said computer to scan said k-space matrix according to a defined spiral scanning trajectory to obtain and make accessible a set of data suitable for image reconstruction, and to modify the scanning to scan only a region of said k-space matrix, by symmetrically shortening said k-space matrix at each of opposite sides thereof in a first direction and shortening one side of said k-space matrix in a second direction orthogonal to said first direction and to conduct said spiral scanning anisotropically in at least one of said first direction or said second direction.

* * * * *